United States Patent
Otsuka

(10) Patent No.: US 11,037,879 B2
(45) Date of Patent: Jun. 15, 2021

(54) SEMICONDUCTOR DEVICE

(71) Applicant: TOSHIBA MEMORY CORPORATION, Tokyo (JP)

(72) Inventor: Yasuo Otsuka, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 8 days.

(21) Appl. No.: 16/553,810

(22) Filed: Aug. 28, 2019

(65) Prior Publication Data

US 2020/0294922 A1   Sep. 17, 2020

(30) Foreign Application Priority Data

Mar. 14, 2019   (JP) .............................. JP2019-046938

(51) Int. Cl.
| | |
|---|---|
| H01L 23/538 | (2006.01) |
| H01L 23/66 | (2006.01) |
| H01L 25/18 | (2006.01) |
| H01L 25/065 | (2006.01) |
| H01L 23/00 | (2006.01) |

(52) U.S. Cl.
CPC ...... *H01L 23/5385* (2013.01); *H01L 23/5386* (2013.01); *H01L 23/66* (2013.01); *H01L 24/48* (2013.01); *H01L 25/0657* (2013.01); *H01L 25/18* (2013.01); *H01L 2223/6605* (2013.01); *H01L 2224/48145* (2013.01); *H01L 2224/48227* (2013.01); *H01L 2225/0651* (2013.01); *H01L 2225/06506* (2013.01); *H01L 2225/06562* (2013.01)

(58) Field of Classification Search
CPC ............. H01L 23/5385; H01L 23/5386; H01L 25/0657
See application file for complete search history.

(56) References Cited

U.S. PATENT DOCUMENTS

| | | | |
|---|---|---|---|
| 6,477,034 B1 | 11/2002 | Chakravorty et al. | |
| 6,514,794 B2* | 2/2003 | Haba | H01L 23/3128 438/109 |
| 7,247,932 B1* | 7/2007 | Lin | H01L 25/0657 257/528 |
| 7,291,929 B2 | 11/2007 | Tanaka et al. | |
| 8,363,421 B2* | 1/2013 | Tsukuda | H01L 23/66 361/783 |
| 8,691,626 B2* | 4/2014 | Su | H01L 21/563 438/108 |
| 10,062,627 B2* | 8/2018 | Iwamoto | H01L 25/0657 |
| 10,090,235 B2* | 10/2018 | Ozawa | H01L 23/49838 |

(Continued)

FOREIGN PATENT DOCUMENTS

| | | |
|---|---|---|
| JP | 2007-287847 A | 11/2007 |
| JP | 2010-199286 A | 9/2010 |

*Primary Examiner* — Nicholas J Tobergte
(74) *Attorney, Agent, or Firm* — Foley & Lardner LLP

(57) ABSTRACT

According to one embodiment, a semiconductor device includes a wiring board, a spacer board that is mounted on the wiring board and in which a power supply conductor layer and a ground conductor layer are provided, at least one first semiconductor chip that is mounted on the spacer board including a power supply layer electrically connected to the power supply conductor layer and a ground layer electrically connected to the ground conductor layer, and a second semiconductor chip that is mounted on the wiring board.

16 Claims, 2 Drawing Sheets

(56) References Cited

U.S. PATENT DOCUMENTS

| | | | |
|---|---|---|---|
| 2002/0127775 A1* | 9/2002 | Haba | H01L 24/48 |
| | | | 438/109 |
| 2007/0170573 A1* | 7/2007 | Kuroda | H01L 23/5386 |
| | | | 257/686 |
| 2014/0103542 A1* | 4/2014 | Katagiri | H01L 23/498 |
| | | | 257/777 |
| 2015/0200187 A1* | 7/2015 | Park | H01L 24/49 |
| | | | 257/777 |
| 2018/0277529 A1* | 9/2018 | Matsumoto | H01L 25/0657 |

* cited by examiner

SEMICONDUCTOR DEVICE

CROSS-REFERENCE TO RELATED APPLICATION

This application is based upon and claims the benefit of priority from Japanese Patent Application No. 2019-046938, filed Mar. 14, 2019, the entire contents of which are incorporated herein by reference.

FIELD

Embodiments described herein relate generally to a semiconductor device.

BACKGROUND

In a semiconductor memory device incorporated with a memory chip such as a NAND flash memory, downsizing and high capacity are rapidly being promoted. In a semiconductor device such as a semiconductor memory device, in order to achieve both size downsizing and high capacity, for example, a configuration is applied, in which a stack of semiconductor chips such as a plurality of memory chips are mounted on a wiring board through spacers, semiconductor chips such as controller chips of the memory chips are mounted on the wiring board, and the plurality of semiconductor chips are sealed with a resin layer. In such a semiconductor device, reducing voltage fluctuation noise between a power supply and a ground is desirable, as the speed of the memory chip is increased.

For example, it is proposed to reduce the resistance and inductance of the ground by disposing a conductor-coated chip between a plurality of semiconductor chips mounted on a wiring board and connecting the ground of the conductor-coated chip and the semiconductor chips, and the ground of the conductor-coated chip and the wiring board with short wires, respectively. Furthermore, a ground conductor layer of the conductor-coated chip and a power supply conductor layer of the semiconductor chip increase the capacitance between the power source and the ground, thereby lowering the impedance between the power source and the ground.

In order to reduce the voltage fluctuation noise between the power supply and the ground of the semiconductor device, the frequency range of the impedance between the power supply and the ground, which needs to be reduced as the speed of the semiconductor device increases, is expanded to a high-frequency domain. Increasing capacitance between the power supply and the ground may reduce the impedance between the high-frequency power supply and the ground. However, in the above-described structure of the related art, since the capacitance is increased by the ground conductor layer of the conductor-coated chip and the power supply conductor layer of the semiconductor chip, the distance between the power supply layer and the ground layer is limited by the thickness of the chip, and it is difficult to further increase the capacitance. For this reason, the expected reduction effect of voltage fluctuation noise between the power supply and the ground cannot be sufficiently obtained.

Examples of related art include JP-A-2010-199286.

DETAILED DESCRIPTION

Figure 1:
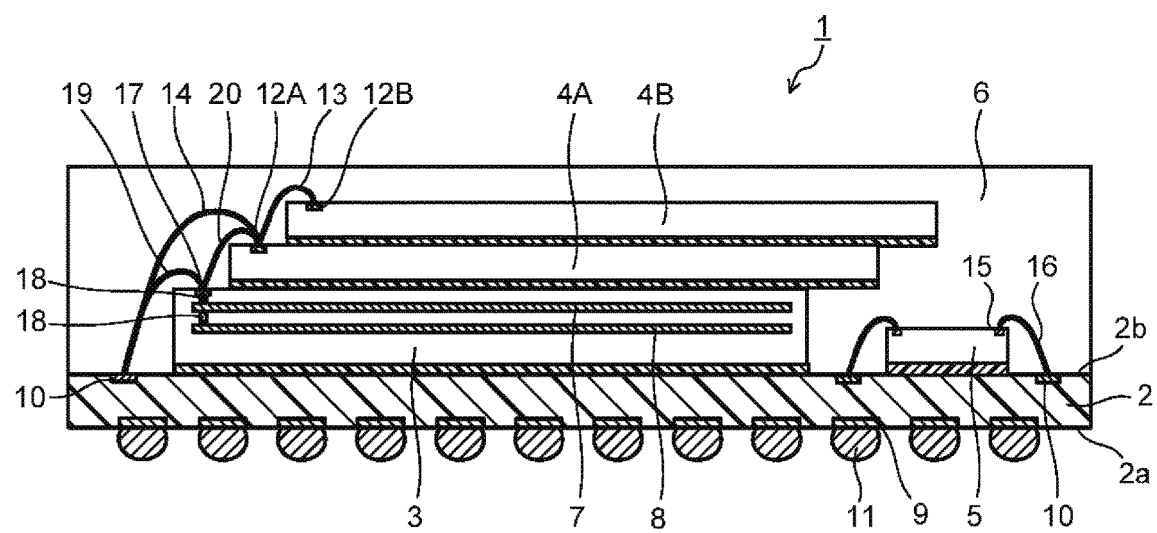
FIG. 1 is a cross-sectional view showing a semiconductor device according to a first embodiment.

Embodiments provide a semiconductor device capable of reducing voltage fluctuation noise between a power supply and a ground by reducing impedance between the high-frequency power supply and the ground.

In general, according to one embodiment, a semiconductor device includes a wiring board including a first surface and a second surface, a spacer board mounted on the first surface of the wiring board, the spacer board including a power supply conductor layer and a ground conductor layer, at least one first semiconductor chip, mounted on the spacer board, that includes a power supply layer electrically connected to the power supply conductor layer and a ground layer electrically connected to the ground conductor layer, and a second semiconductor chip mounted on first surface of the wiring board.

Hereinafter, a semiconductor device of embodiments will be described with reference to drawings. In each embodiment, the same components are substantially denoted by the same reference numerals, and the description thereof may be partially omitted. The drawings are schematic, and the relationship between the thickness and the planar dimension, the proportion of the thickness of each part, and the like may be different from an actual one. The terms indicating the directions such as upper and lower in the description indicates a relative direction when a surface of a wiring board to be described later where a semiconductor chip is mounted is an upward surface unless otherwise specified and may be different from actual directions based on the gravitational acceleration directions.

First Embodiment

FIG. 1 is a cross-sectional view showing a configuration of a semiconductor device according to a first embodiment. A semiconductor device 1 shown in FIG. 1 includes a wiring board 2, a spacer board 3 mounted on the wiring board 2, a plurality of first semiconductor chips 4 (4A and 4B) mounted on the spacer board 3, a second semiconductor chip 5 mounted on the wiring board 2 with a mounting space provided by the spacer board 3, and a sealing resin layer 6 that seals the first and second semiconductor chips 4 and 5. A power supply conductor layer 7 and a ground conductor layer 8 are provided in the spacer board 3 as will be described in detail later.

For example, the wiring board 2 may be a wiring board including an insulating resin board and a wiring network (not shown) provided on the surface or inside the insulating resin board, and more specifically, a printed wiring board (multilayer printed board or the like) including glass-epoxy resin or bismaleimide triazine (BT) resin. The wiring board 2 such as a printed wiring board usually includes a Cu layer (not shown) as a wiring network. The wiring board 2 includes a first surface 2a which is a surface on which external terminals are formed, and a second surface 2b which is a surface on which the first and second semiconductor chips 4 and 5 are mounted.

A plurality of external electrodes 9 are provided on the first surface 2a of the wiring board 2. The second surface 2b of the wiring board 2 is provided with a plurality of internal electrodes 10 serving as an electrical connection portion between the power supply conductor layer 7 and the ground conductor layer 8 of the spacer board 3, and the first and second semiconductor chips 4 and 5 and electrically connected to external electrodes 9 by internal wiring (not shown). An external terminal 11 is formed on the external electrode 9 of the wiring board 2. When the semiconductor device 1 is used as a BGA package, the external terminals 11 are formed of connection terminals (ball electrodes) using solder balls or solder plating. When the semiconductor device 1 is used as an LGA package, a metal land using Au plating or the like is applied as the external terminal 11.

The plurality of first semiconductor chips 4A and 4B are disposed on the spacer board 3 mounted on the second surface 2b of the wiring board 2. The first semiconductor chips 4A and 4B each includes a plurality of electrode pads 12 (12A and 12B). The first semiconductor chips 4A and 4B are stacked in a step-like manner so that the respective electrode pads 12A and 12B are exposed (e.g., not overlapped by the neighboring semiconductor chip). While a memory chip such as a NAND flash memory may be a specific example of the first semiconductor chip 4, any other memory chip may be used. FIG. 1 shows a structure in which two first semiconductor chips 4A and 4B are stacked in a step-like manner, in which the number of the first semiconductor chips 4 mounted on the wiring board 2 and the mounting structure may be freely set. The number of the first semiconductor chips 4 is two or may be one or three or more. Among the plurality of electrode pads 12 of the first semiconductor chip 4, signal pads are connected by wires 13 therebetween and are further connected to the internal electrodes 10 of the wiring board 2 by wires 14.

The second semiconductor chip 5 is further mounted on the second surface 2b of the wiring board 2. At least a portion of the second semiconductor chip 5 is disposed in a space below respective portions of the plurality of semiconductor chips 4A and 4B, which are stacked in a step-like manner. Each of the portions of the semiconductor chips 4A and 4B each protrudes from a side surface of the spacer board 3 and is raised by the spacer board 3 relative to the second surface 2b of the wiring board 2. The second semiconductor chip 5 includes a plurality of electrode pads 15, and these electrode pads 15 are electrically connected to the internal electrodes 10 of the wiring board 2 through wires 16. Examples of the second semiconductor chip 5 include a system LSI chip such as a controller chip, an interface chip, a logic chip, an RF chip, and the like that transmit and receive digital signals between the memory chip as the first semiconductor chip 4 and external devices. By mounting the second semiconductor chip 5 on the second surface 2b of the wiring board 2, the wiring length from the second semiconductor chip 5 such as a controller chip or a system LSI chip to the wiring board 2 can be shortened, and the speed of the semiconductor device 1 can be increased.

For example, a silicone spacer may used as the spacer board 3. Alternatively, a normal wiring board may be used as the spacer board 3. The spacer board 3 raises the position of the first semiconductor chip 4 in order to provide the mounting space for the second semiconductor chip 5 as described above. In the semiconductor device 1 of the embodiment, the power supply conductor layer 7 and the ground conductor layer 8 are provided in the spacer board 3. Furthermore, the spacer board 3 includes a plurality of electrode pads 17, and a plurality of vias 18 is provided therein. The power supply conductor layer 7 is connected to at least one electrode pad 17 through at least one via 18, and the electrode pad 17 is further connected to the power supply electrode of the internal electrode 10 of the wiring board 2 by a wire 19. The ground conductor layer 8 is connected to another electrode pad 17 through another via 18, and the electrode pad 17 is further connected to the ground electrode of the internal electrode 10 of the wiring board 2 by the wire 19. A plurality of power supply conductor layers 7 and ground conductor layers 8 may be provided in the spacer board 3, respectively.

Among the plurality of electrode pads 12A and 12B of the first semiconductor chips 4A and 4B, power supply pads are connected by wires 13 therebetween and further connected with the electrode pads 17 connected to the power supply conductor layer 7 of the spacer board 3 by wires 20. Among the plurality of electrode pads 12A and 12B of the first semiconductor chips 4A and 4B, ground pads are connected by the wires 13 therebetween and further connected with the electrode pads 17 connected to the ground conductor layer 8 of the spacer board 3 by the wires 20. That is, the power supply layer provided in the first semiconductor chip 4 is connected to the power supply conductor layer 7 of the spacer board 3 and further connected to the power supply electrode of the wiring board 2. The ground layer provided in the first semiconductor chip 4 is connected to the ground conductor layer 8 of the spacer board 3 and further connected to the ground electrode of the wiring board 2.

Thus, by electrically connecting the power supply layer (not shown) of the first semiconductor chip 4 with the power supply conductor layer 7 of the spacer board 3 and electrically connecting the ground layer (not shown) of the first semiconductor chip 4 with the ground conductor layer 8 of the spacer board 3, the capacitance can be increased between the power supply conductor layer 7 and the ground conductor layer 8 of the spacer board 3. The distance between the power supply conductor layer 7 and the ground conductor layer 8 may be set to a necessary distance while it is limited within the thickness of the spacer board 3, and the capacitance between the power supply and the ground may be increased. Furthermore, the distance between the power supply layer and the ground layer of the first semiconductor chip 4 and the power supply conductor layer 7 and the ground conductor layer 8 can be shortened. Therefore, even when the frequency of the first semiconductor chips 4A and 4B is increased, the impedance between the high-frequency power supply and the ground can be lowered.

An impedance Z is expressed by the following equation with respect to a frequency f, an inductance L, and a capacitance C.

$$|Z|=|2\pi fL-(1/2\pi fC)|$$

As described above, even when the frequency f is increased, by increasing the capacitance C and decreasing the inductance L, the impedance Z can be reduced. Since the inductance L generally becomes larger as the distance of the wiring becomes longer if other conditions are the same, it is required to shorten the wiring as much as possible. By reducing the impedance Z, it is possible to reduce voltage fluctuation noise between the power supply and the ground. Thus, even when the impedance between the power supply and the ground is increased with the increased speed of the semiconductor device 1, by increasing the capacitance between the power supply and the ground to reduce the impedance, it is possible to reduce voltage fluctuation noise between the power supply and the ground. Therefore, it is possible to improve the operation characteristics, reliability, and the like of the semiconductor device 1 including the first semiconductor chip (memory chip) 4 whose speed is increased and frequency is increased and to reduce adverse effects on external devices and the like. Furthermore, by increasing the capacitance between the power supply and the ground, the mounting of a chip capacitor can be omitted, and the semiconductor device 1 can be reduced in size and cost.

Second Embodiment

Figure 2:
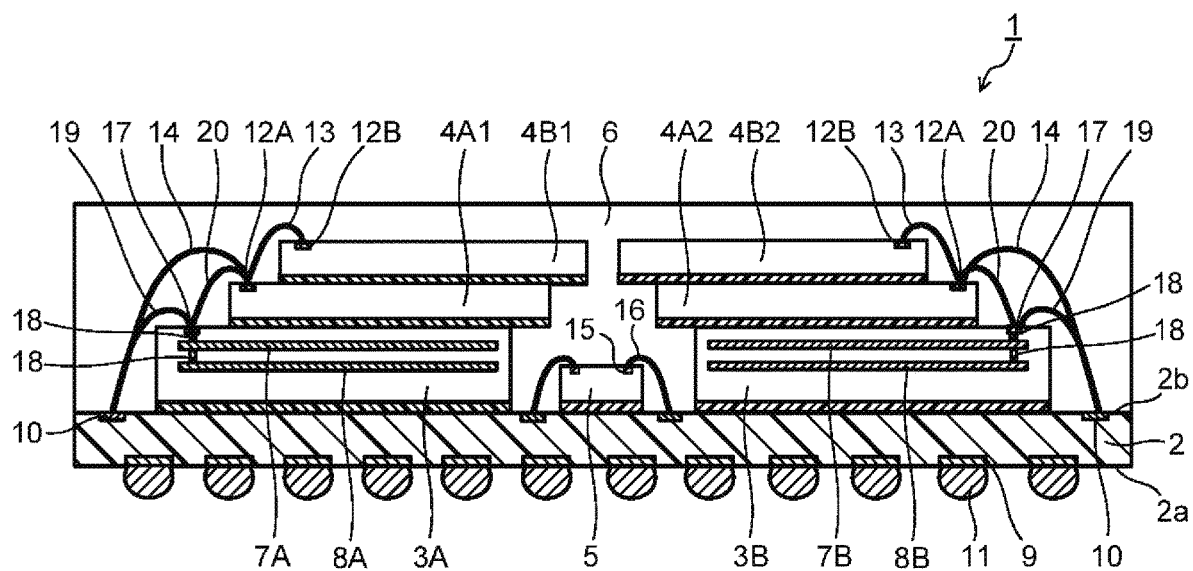
FIG. 2 is a cross-sectional view showing a semiconductor device according to a second embodiment.

FIG. 2 is a cross-sectional view showing a configuration of a semiconductor device according to a second embodiment. The semiconductor device 1 shown in FIG. 2 includes two spacer boards 3A and 3B mounted on the wiring board 2. Two first semiconductor chips 4A (4A1 and 4A2) and 4B (4B1 and 4B2) are mounted on the two spacer boards 3A and 3B, respectively. The spacer board 3A and the first semiconductor chips 4A1 and 4B1 mounted thereon, and the spacer board 3B and the first semiconductor chips 4A2 and 4B2 mounted thereon have the same structure except that the right and left are reversed on the wiring board 2, and the connection structure therebetween and the connection structure with the wiring board 2 also have the same structure except that the right and left are reversed.

Further, the connection structure between the spacer boards 3A and 3B, the first semiconductor chips 4A1, 4B1, 4A2, and 4B2, and the wiring board 2 is the same as the connection structure of the first embodiment except for the right-left reverse state of the spacer board 3B and the first semiconductor chips 4A2 and 4B2, and connection is performed using the wires 13, 14, 19, and 20, respectively. In the semiconductor device 1 of the second embodiment, the second semiconductor chip 5 is mounted between the two spacer boards 3A and 3B of the wiring board 2. That is, the second semiconductor chip 5 is disposed in a space including the lower side of the portion of the first semiconductor chips 4A1 and 4B1 stacked in a step-like manner that protrudes from the spacer board 3A, and the lower side of the portion of the first semiconductor chips 4A2 and 4B2 stacked in a step-like manner that protrudes from the spacer board 3B. The two spacer boards 3A and 3B respectively include power supply conductor layers 7A and 7B and ground conductor layers 8A and 8B.

By connecting the power supply conductor layer 7A and the ground conductor layer 8A of the spacer board 3A with the power supply layer and the ground layer provided in the first semiconductor chips 4A1 and 4B1 and connecting the power supply conductor layer 7B and the ground conductor layer 8B of the spacer board 3B with the power supply layer and the ground layer provided in the first semiconductor chips 4A2 and 4B2, it is possible to increase the capacitance between the power supply and ground, respectively and further to shorten the distance between the power supply layers and the ground layers of the first semiconductor chips 4A1, 4B1, 4A2, and 4B2, and the power supply conductor layers 7A and 7B, and the ground conductor layers 8A and 8B. Therefore, even when the frequency of the first semiconductor chips 4A1, 4B1, 4A2, and 4B2 is increased, the impedance between the high-frequency power supply and the ground can be lowered. In this way, voltage fluctuation noise between the power supply and the ground is reduced. Therefore, it is possible to improve the operation characteristics, reliability, and the like of the semiconductor device 1 including the first semiconductor chip (memory chip) 4 whose speed is increased and frequency is increased and to reduce adverse effects on external devices and the like.

Third Embodiment

Figure 3:
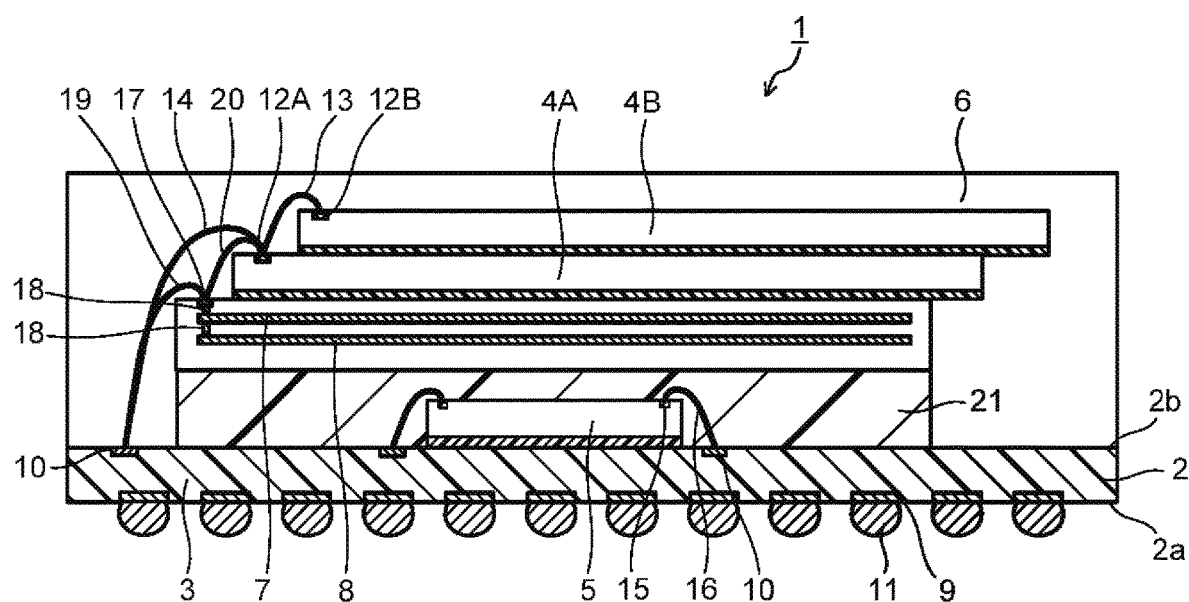
FIG. 3 is a cross-sectional view showing a semiconductor device according to a third embodiment.

FIG. 3 is a cross-sectional view showing a configuration of a semiconductor device according to a third embodiment. In the semiconductor device 1 shown in FIG. 3, the second semiconductor chip 5 is disposed in an adhesive layer 21 on which the spacer board 3 is mounted on the wiring board 2. That is, in the semiconductor device 1 of the third embodiment, a film on die structure is applied, and the spacer board 3 is mounted on the wiring board 2 via the adhesive layer 21, and the second semiconductor chip 5 is embedded in the adhesive layer 21. The semiconductor device 1 according to the third embodiment has the same structure and connection structure as the semiconductor device 1 according to the first embodiment except for the structure in which the second semiconductor chip 5 is embedded in the adhesive layer 21.

That is, by connecting the power supply conductor layer 7 and the ground conductor layer 8 of the spacer board 3 with the power supply layer and the ground layer provided in the first semiconductor chips 4A and 4B, the capacitance between the power supply and the ground is increased. Furthermore, the distance between the power supply layer and the ground layer of the first semiconductor chips 4A and 4B, and the power supply conductor layer 7 and the ground conductor layer 8 is shortened. Therefore, even when the frequency of the first semiconductor chips 4A and 4B is increased, the impedance between the high-frequency power supply and the ground can be lowered. In this way, it is possible to reduce voltage fluctuation noise between the power supply and the ground. Therefore, it is possible to improve the operation characteristics, reliability, and the like of the semiconductor device 1 including the first semiconductor chip (memory chip) 4 whose speed is increased and frequency is increased and to reduce adverse effects on external devices and the like.

The configurations of the embodiments described above may be applied in combination, respectively and may be partially replaced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a wiring board including a first surface and a second surface;
   a spacer board mounted on the first surface of the wiring board, the spacer board including a power supply conductor layer and a ground conductor layer provided;
   at least one first semiconductor chip, mounted on the spacer board, that includes a power supply layer electrically connected to the power supply conductor layer and a ground layer electrically connected to the ground conductor layer; and
   a second semiconductor chip mounted on the first surface of the wiring board,
   wherein
   the spacer board includes a power supply pad electrically connected to the power supply conductor layer and a ground pad electrically connected to the ground conductor layer, and
   the first semiconductor chip includes an electrode pad electrically connected to the power supply pad of the spacer board through a first wire and an electrode pad electrically connected to the ground pad of the spacer board through a second wire, the spacer board having a third surface facing the first surface and a fourth surface opposite to the third surface, the power supply pad and the ground pad are only provided on the fourth surface.

2. The semiconductor device according to claim 1, further comprising:
one or more third semiconductor chips stacked and mounted on the spacer board, wherein the first semiconductor chip and the one or more third semiconductor chips are arranged in a step-like configuration.

3. The semiconductor device according to claim 1, wherein
at least a portion of the second semiconductor chip is located directly below a portion of the first semiconductor chip that protrudes from a side surface of the spacer board.

4. The semiconductor device according to claim 1, wherein
the second semiconductor chip is embedded in an adhesive layer disposed between the spacer board on the wiring board.

5. The semiconductor device according to claim 1, further comprising:
a plurality of terminals disposed on the second surface of the wiring board, each of the plurality of terminals including at least one of: a solder ball, a solder plating, or a gold (Au) plating.

6. The semiconductor device according to claim 1, further comprising:
a sealing resin layer overlaying the wiring board, the spacer board, the at least one first semiconductor chip, and the second semiconductor chip.

7. A semiconductor device comprising:
a wiring board including a first surface and a second surface;
a first spacer board mounted on the first surface of the wiring board, the first spacer board including a first power supply conductor layer and a first ground conductor layer provided;
a second spacer board mounted on the first surface of the wiring board, the second spacer board including a third power supply conductor layer and a fourth ground conductor layer provided;
a first semiconductor chip, mounted on the first spacer board, that includes a first power supply layer electrically connected to the first power supply conductor layer and a first ground layer electrically connected to the first ground conductor layer;
a second semiconductor chip, mounted on the second spacer board, that includes a third power supply layer electrically connected to the third power supply conductor layer and a fourth ground layer electrically connected to the fourth ground conductor layer; and
a third semiconductor chip mounted on the first surface of the wiring board and between the first and second spacer boards,
wherein the first semiconductor chip includes a first portion protruding from a first side surface of the first spacer board, and the second semiconductor chip includes a second portion protruding from a second side surface of the second spacer board, the first and second side surfaces facing each other.

8. The semiconductor device according to claim 7, wherein the third semiconductor chip is disposed between the first and second side surfaces.

9. The semiconductor device according to claim 7, further comprising:
a sealing resin layer overlaying the wiring board, the first spacer board, the second spacer board, the first semiconductor chip, the second semiconductor chip, and the third semiconductor chip.

10. The semiconductor device according to claim 7, further comprising:
a plurality of terminals disposed on the second surface of the wiring board, each of the plurality of terminals including at least one of: a solder ball, a solder plating, or a gold (Au) plating.

11. A semiconductor device comprising:
a wiring board including a first surface and a second surface;
a first spacer board mounted on the first surface of the wiring board, the first spacer board including a first power supply conductor layer and a first ground conductor layer provided;
a second spacer board mounted on the first surface of the wiring board, the second spacer board including a third power supply conductor layer and a fourth ground conductor layer provided;
a first semiconductor chip, mounted on the first spacer board, that includes a first power supply layer electrically connected to the first power supply conductor layer and a first ground layer electrically connected to the first ground conductor layer;
a second semiconductor chip, mounted on the second spacer board, that includes a third power supply layer electrically connected to the third power supply conductor layer and a fourth ground layer electrically connected to the fourth ground conductor layer; and
a third semiconductor chip mounted on the first surface of the wiring board and between the first and second spacer boards,
wherein at least a portion of the third semiconductor chip is disposed below the first portion of the first semiconductor chip and the second portion of the second semiconductor chip.

12. The semiconductor device according to claim 11, further comprising:
a sealing resin layer overlaying the wiring board, the first spacer board, the second spacer board, the first semiconductor chip, the second semiconductor chip, and the third semiconductor chip.

13. The semiconductor device according to claim 11, wherein the third semiconductor chip is disposed between the first and second side surfaces.

14. The semiconductor device according to claim 1, wherein the power supply pad is configured to be provided with a first voltage and the ground pad is configured to be provided with a second voltage lower than the first voltage.

15. The semiconductor device according to claim 1, wherein the wiring board further comprises:
a first power supply pad and a second ground pad on the first surface;
a third wire connecting to the first power pad and the power pad; and
a fourth wire connecting to the first ground pad and the ground pad.

16. The semiconductor device according to claim 11, further comprising:
a plurality of terminals disposed on the second surface of the wiring board, each of the plurality of terminals including at least one of: a solder ball, a solder plating, or a gold (Au) plating.

* * * * *